United States Patent [19]

White

[11] Patent Number: 5,142,238
[45] Date of Patent: Aug. 25, 1992

[54] SWITCHED-CAPACITOR DIFFERENTIAL AMPLIFIER

[75] Inventor: Bert White, Irvine, Calif.

[73] Assignee: Silicon Systems, Inc., Tustin, Calif.

[21] Appl. No.: 732,474

[22] Filed: Jul. 18, 1991

[51] Int. Cl.$^5$ ............................ H03F 1/02; H03F 3/16
[52] U.S. Cl. ............................................ 330/9; 330/51
[58] Field of Search .................... 330/9, 51, 107, 252, 330/258, 69

[56] References Cited

U.S. PATENT DOCUMENTS

| | | | |
|---|---|---|---|
| 4,521,743 | 6/1985 | Heimer | 330/9 |
| 4,617,481 | 10/1986 | Masuda | 330/9 |
| 4,763,088 | 8/1988 | Negahban-Hagh | 330/9 |
| 4,808,942 | 2/1989 | Milkovic | 330/9 |
| 4,908,579 | 3/1990 | Tawfik et al. | 330/9 |

Primary Examiner—Eugene R. LaRoche
Assistant Examiner—Tan Dinh
Attorney, Agent, or Firm—Hecker & Harriman

[57] ABSTRACT

The switched-capacitor differential amplifier circuit of the present invention employs a more efficient switched-capacitor network to provide a common mode range which is not limited by the amplifier power supply, and to achieve a high common mode rejection ratio at high frequencies with decreased sensitivity to component tolerances. The circuit employs a two-phase system, during the first phase of which, the circuit is auto-zeroed, the differential inputs are sampled and the capacitors are pre-charged. During the second phase, the differential inputs are disconnected and the bottom plates of the input capacitors are coupled together. The charge redistribution within the circuit forms an output potential that is proportional to the difference between the input signals, and that is offset by a user specified voltage. The present invention substantially eliminates the effects of parasitic capacitance.

19 Claims, 5 Drawing Sheets

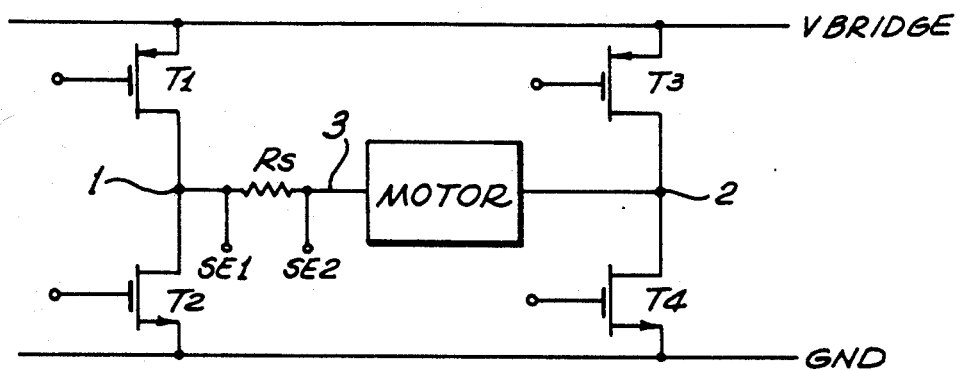
FIG. 1
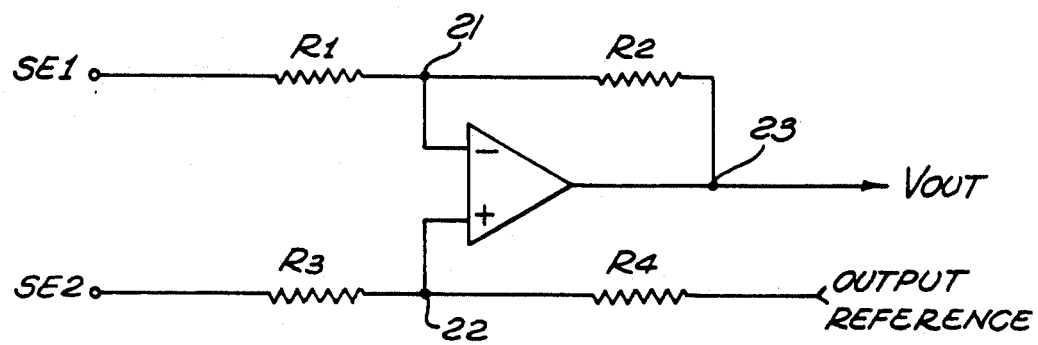
FIG. 2 (PRIOR ART.)
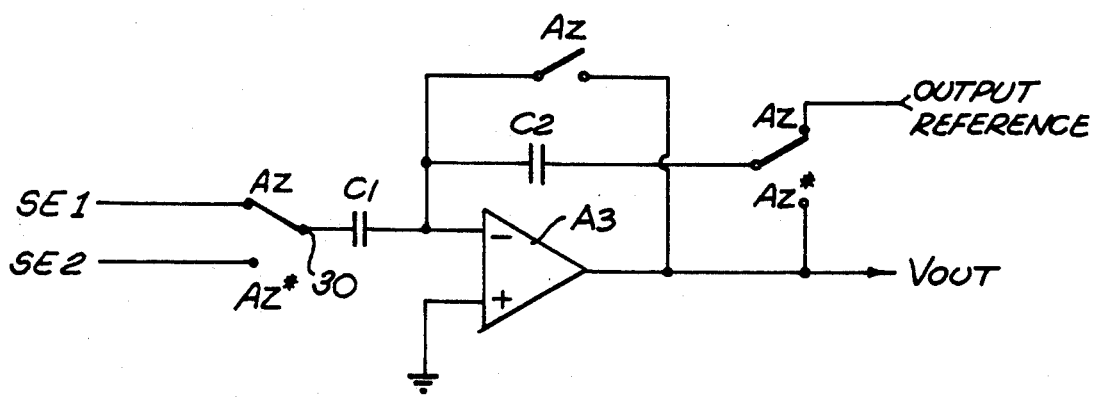
FIG. 3 (PRIOR ART.)

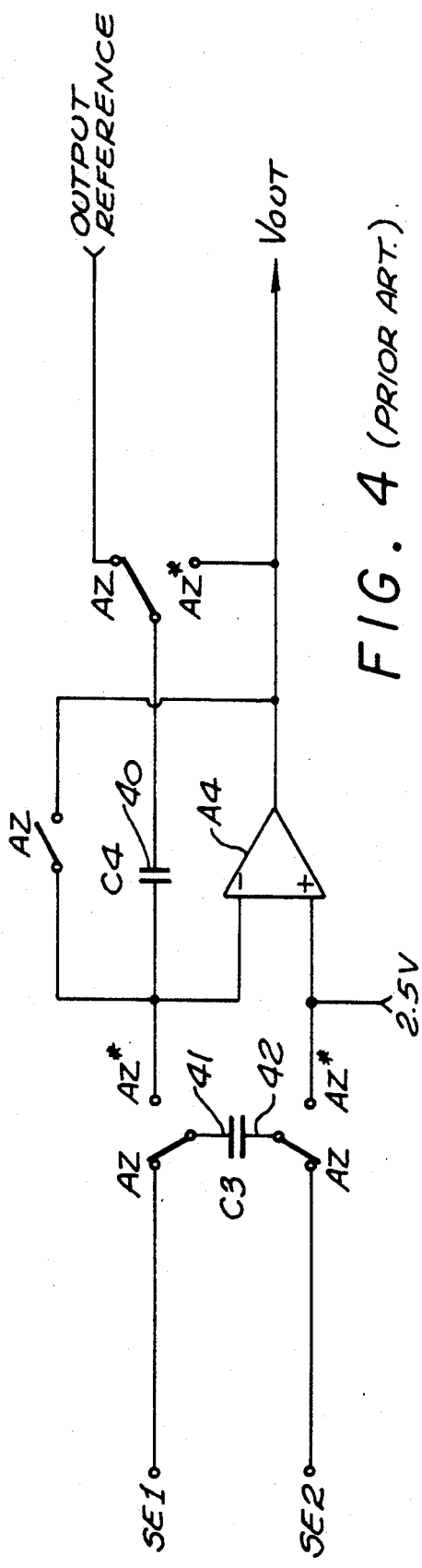
FIG. 4 (PRIOR ART.)
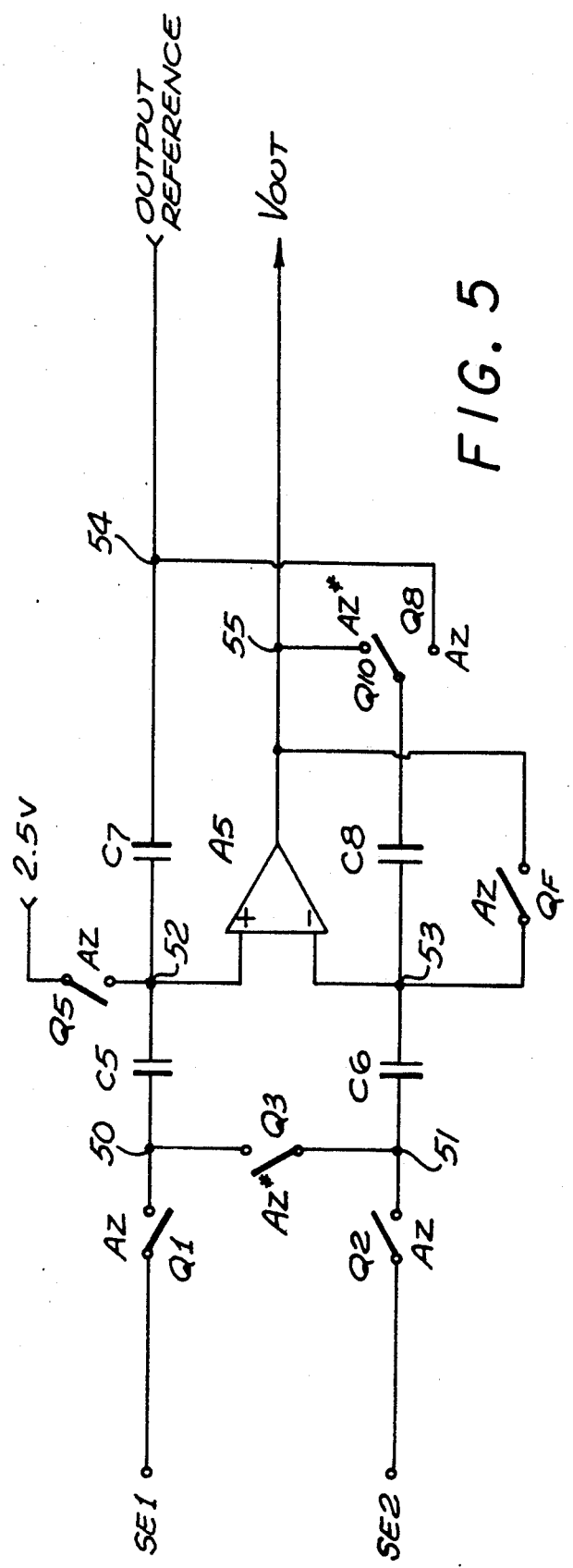
FIG. 5

SWITCHED-CAPACITOR DIFFERENTIAL AMPLIFIER

BACKGROUND OF THE INVENTION

1. Field of the Invention

This invention relates to the field of switched-capacitor, differential amplifiers.

2. Background Art

Computer systems utilizing disk drives for memory storage contain an assembly of electrical and mechanical components known as the head/disk assembly. Within this assembly, one or more disks are situated on a spindle to provide disk rotation.

At least one recording head is positioned above each data surface of each disk to read and write data. The recording heads are attached to a positioning apparatus (servo system) which provides for radial or angular movement across the surfaces of the disks. This apparatus is responsible for positioning the heads over the desired tracks on the disks.

A servo motor, such as a voice coil motor, having a primarily inductive impedance, is attached to the positioning means to control the radial movement of the heads in response to a control current received from the disk drive servo system. The servo motor responds to servo position error signals obtained from the disk surface to modify the motor current and, thus, modify the position of the recording heads.

It is sometimes desirable to be able to sense the amount of electrical current flowing through the servo motor so that the current value can be implemented in a feedback loop with the motor control circuitry within the servo system.

One method for sensing the current involves reading the voltage across a sensing resistor that is connected in series with the servo motor. The current flowing through the motor is equivalent to that flowing through the resistor. Since the resistor voltage is proportional to the resistor current, it is likewise proportional to the motor current.

A typical bridge structure showing the connections of a prior art servo motor and the series resistor is given in FIG. 1. The circuitry shown forms what is called an "H" bridge. This bridge is formed with two transistors in series between the bridge voltage (VBRIDGE) and ground (GND), the junction of these transistors forming node 1. Another pair of transistors connected in the same fashion form node 2 at their joint connection. The sensing resistor (RS) and the servo motor are connected in series between nodes 1 and 2. By adjusting the gate voltages of transistors T1-T4, the driving currents for the servo motor can be controlled. To sense the current passing through the motor, the voltage across series resistor RS is sampled at node 1 and node 3 as signals SE1 and SE2 respectively. These signals, SE1 and SE2, are provided to a differential amplifier to sense the voltage differential.

Because the motor impedance is inductive, small changes in motor current cause large voltage swings across the motor. The amplifier must be able to sense small differential voltages (on the order of 1-10 millivolts) in the presence of common mode signals that can vary from ground to the bridge voltage (normally a 12 volt range). The goals for such an amplifier are to:

1. Achieve high common mode rejection both at DC and at frequencies approaching 100 kilohertz,
2. Operate accurately with a common mode voltage as high as 13.2 volts while operating from a 5 volt power supply,
3. Provide an output that is referenced to a user supplied input voltage,
4. Provide low output offset,
5. Provide high gain accuracy.

A conventional circuit for a differential amplifier is shown in FIG. 2. The voltage signal SE1 is provided to resistor R1 which is in turn coupled to node 21. Resistor R2 is coupled between node 21 and output node 23. The voltage signal SE2 is provided to resistor R3 which is in turn coupled to node 22. Resistor R4 is coupled between an output reference voltage source and node 22. Node 21 and node 22 are coupled to the negative differential input and positive differential input respectively of the differential amplifier A2. The output of amplifier A2 is coupled to output node 23. The output voltage ($V_{OUT}$) is given by:

$$V_{OUT} = (SE2 - SE1)\left(\frac{R2}{R1}\right) + \text{Output Reference}$$

for resistance values where R1=R3 and R2=R4.

The circuit shown in FIG. 2 has several disadvantages, particularly when fabricated in a CMOS process. For example, if the circuit is designed with a gain of four for the differential inputs, the common mode range of the amplifier must be 4/5 of the common mode input. Thus the circuit cannot handle a common mode input of greater than 6.25 volts and still remain within the 5 volt supply limit. This eliminates the use of high quality amplifiers in this circuit. Also, the common mode rejection of the circuit relies on resistor matching. A 1% resistor mismatch will limit the common mode rejection ratio (CMRR) to 40dB. Another disadvantage is that the circuit operates in continuous time and therefore is not easily auto-zeroed to reduce the effects of amplifier offset.

An alternate prior art differential amplifier utilizes switched capacitor circuitry. One such conventional switched-capacitor circuit for differential amplifiers is shown in FIG. 3. The circuit switches according to control signals AZ and AZ*. These signals represent alternating, non-overlapping timing signals. During the phase when AZ is high, signal SE1 is provided to capacitor C1 which is in turn coupled to the negative input of the differential amplifier A3. The output of amplifier A3 is coupled to the negative input to provide feedback. The positive input of the amplifier is connected to ground. During this phase, node 30 is charged to the value of signal SE1. Since the positive input of the amplifier is grounded and the output of the amplifier is directly coupled to the negative input, the amplifier is auto-zeroed. Capacitor C2 is charged up to the value of the output reference signal.

During the phase when AZ* is high, the direct feedback is cut off and capacitor C2 is connected in a feedback loop. $V_{OUT}$ receives the stored output reference charge from the capacitor C2. The signal SE2 is provided to capacitor C1 at node 30, thus causing a potential change at the negative input of the amplifier corresponding to the difference between signal SE2 and SE1. The potential change at the negative input of the amplifier also causes a potential change at $V_{OUT}$. The potential at $V_{OUT}$ is given as:

$$V_{OUT} = (SE1 - SE2)\left(\frac{C1}{C2}\right) + \text{Output Reference}$$

The valid output for this circuit is available only during the phase when AZ* is high.

This circuit has several advantages over the continuous time version of FIG. 2. The amplifier is auto-zeroed to reduce the offset effects of the amplifier circuitry. Also, the common mode rejection is independent of component tolerances and the operational amplifier can be operated from a 5 volt supply. A disadvantage of this circuit is that the common mode rejection ratio (CMRR) is unacceptable at high frequencies. This is due to the fact that SE1 and SE2 are not sampled at the same time.

A switched capacitor circuit of the prior art that allows for simultaneous sampling of SE1 and SE2 is shown in FIG. 4. In this circuit, signals SE1 and SE2 are each provided to a separate plate of capacitor C3, during the phase when AZ is high. Other than that, the circuit maintains the same structure as that shown in FIG. 3 for the AZ phase. The amplifier has direct negative feedback and is auto-zeroed to a value of 2.5 volts. The capacitor C4 is charged up on one plate to the value of the output reference voltage and on the other plate, to 2.5 volts, where it is coupled to the negative input of the amplifier. The zeroing value of 2.5 volts is used because it lies at the midpoint of the 5 volt supply range. For other supply voltages, the value would be roughly equivalent to the midpoint of the voltage supply. The potential across capacitor C3 is equivalent to the voltage difference between SE2 and SE1.

During the phase when AZ* is high, capacitor C3 is disconnected from the signal lines of SE1 and SE2 and connected to the positive and negative inputs of the amplifier A4. At the same time, the direct feedback is disconnected and the output line is connected to plate 40 of capacitor C4. This charges $V_{OUT}$ to a potential equal to the output reference voltage. The connection of capacitor C3 to the amplifier inputs triggers a potential change at the negative input that is proportional to the voltage difference SE2−SE1. The redistribution of charge also triggers a voltage change at $V_{OUT}$. $V_{OUT}$ is given by:

$$V_{OUT} = (SE2 - SE1)\left(\frac{C3}{C4}\right) + \text{Output Reference}$$

This circuit has the advantages of auto-zeroing, simultaneous sampling, and 5 volt supply operation. However, its common mode rejection ratio is poor because it is sensitive to parasitic capacitances at nodes 41 and 42. These parasitic capacitances serve to capacitively couple nodes 41 and 42 to ground. It is desirable to have an amplifier configuration which provides for a high common mode range that is not limited by the amplifier power supply, common mode rejection that is insensitive to component tolerance, auto-zeroing, and simultaneous sampling. The desired configuration must not be sensitive to parasitic capacitance as is the circuit of FIG. 4.

SUMMARY

The switched-capacitor, differential amplifier circuit of the present invention employs a more efficient switched-capacitor network to provide a common mode range which is not limited by the amplifier power supply, and to achieve a high common mode rejection ratio at high frequencies with decreased sensitivity to component tolerances.

The circuit employs a multi-phase system, during one phase of which, the circuit is auto-zeroed, the differential inputs are sampled and the capacitors are precharged. During a second phase, the differential inputs are disconnected and the bottom plates of the input capacitors are coupled together. The charge redistribution within the circuit forms an output potential that is proportional to the difference between the input signals, and that is offset by a user specified voltage. Unlike previous circuits, the performance of the present invention is not inhibited by parasitic capacitance.

BRIEF DESCRIPTION OF THE DRAWINGS

FIG. 1 illustrates an "H" bridge used to drive a servo motor, which represents one environment in which the present invention may be operated.

FIG. 2 illustrates a continuous-time differential amplifier configuration of prior art.

FIG. 3 illustrates a switched-capacitor, differential amplifier configuration with non-simultaneous sampling used in prior art.

FIG. 4 illustrates a switched-capacitor, differential amplifier configuration with simultaneous sampling used in prior art.

FIG. 5 illustrates the switched-capacitor, differential amplifier configuration of the present invention.

DETAILED DESCRIPTION

Figure 6:
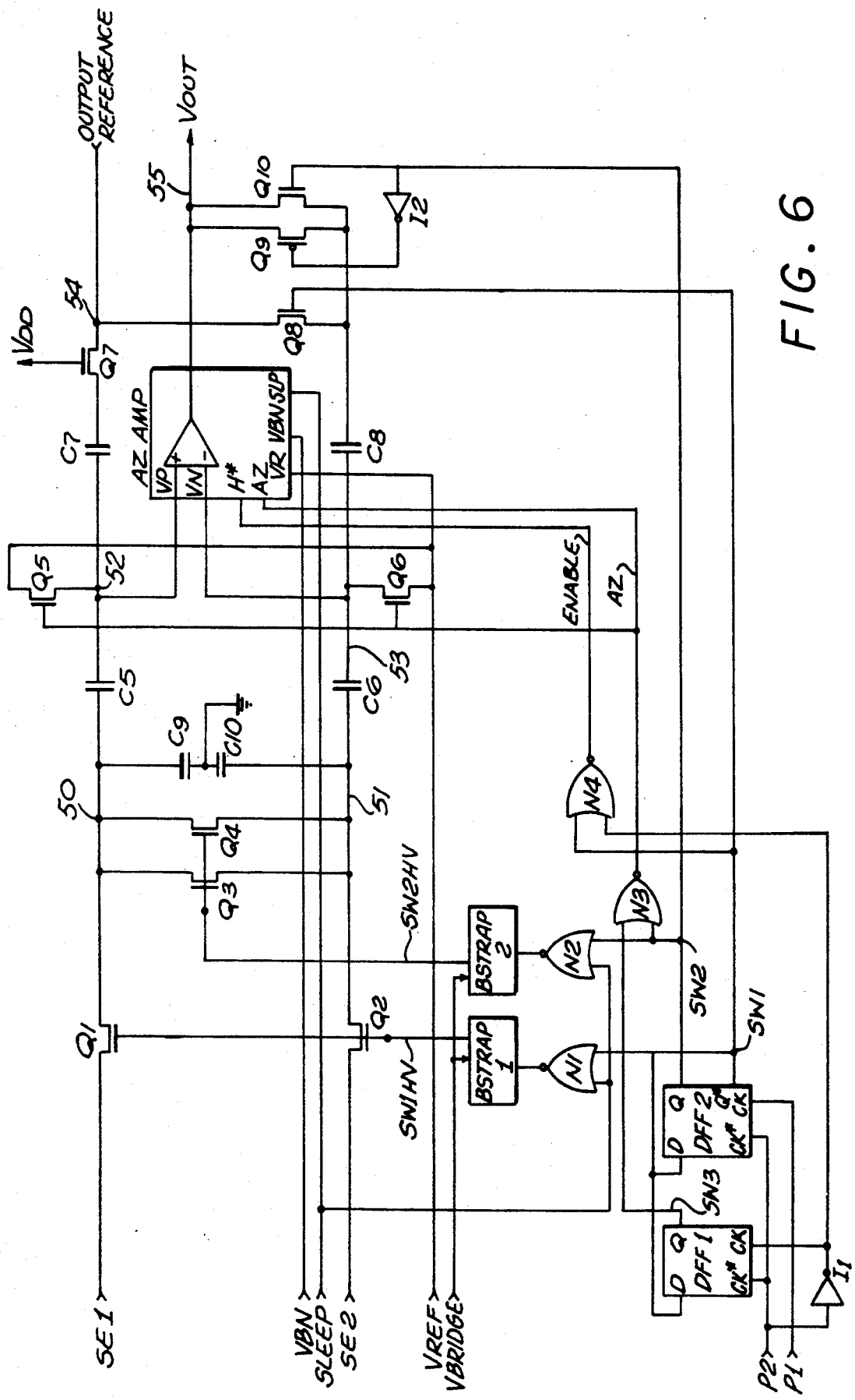
FIG. 6 illustrates the preferred embodiment of the present invention.

An improved switched-capacitor, differential amplifier for achieving a high common mode rejection ratio at high frequencies and for providing a common mode range independent of amplifier power supply limits is described. In the following description, numerous specific details, such as power supply values, bias voltages, etc. are described in detail in order to provide a more thorough description of the present invention. It will be apparent, however, to one skilled in the art, that the present invention may be practiced without these specific details. In other instances, well known features have not been described in detail in order not to unnecessarily obscure the present invention.

In the present invention, a switched-capacitor, differential amplifier configuration operating in a multi-phase process is able to achieve a large high frequency common mode rejection ratio and a high common mode range independent of amplifier power supply. During one phase of the process, the amplifier is auto zeroed and the capacitors are precharged to the input voltage values. During a second phase, the input capacitors with the sampled input values stored on them are coupled together and capacitive feedback is established. The resulting output is proportional to the difference between the sampled input values offset by a user supplied potential. This circuit is insensitive to component tolerance and parasitic capacitance unlike circuits of the prior art.

The switched-capacitor, differential amplifier circuit of the present invention is illustrated in FIG. 5. Signal SE1 is provided to switch Q1, coupled to node 50. Signal SE2 is provided to switch Q2, coupled to node 51. Switch Q3 is coupled between nodes 50 and 51. The bottom and top plates of capacitor C5 are coupled to nodes 50 and 52, respectively. The bottom and top plates of capacitor C6 are coupled to nodes 51 and 53, respectively. Note that it is possible to operate this circuit with the top plates and bottom plates of the capacitors reversed. Switch Q5 is coupled between node 52 and a bias voltage equal to one-half of the amplifier power supply voltage (i.e. 2.5 volts for a 5 volt supply). The top plates of capacitors C7 and C8 are coupled to nodes 52 and 53, respectively. Also, coupled to nodes 52 and 53 are the positive input and negative input, respectively, of the amplifier A5. The output of amplifier A5 is coupled to node 55 which represents the output signal $V_{OUT}$. The switch Q8 and the bottom plate of capacitor C7 are both coupled to an output reference voltage at node 54. The bottom plate of capacitor C8 is coupled to switches Q8 and Q10. Switch Q10 is also coupled to node 55. Switch QF is coupled between node 53 and node 55.

The switches Q1, Q2, Q5, Q8 and QF are closed when the AZ signal is high. Switches Q3 and Q10 are closed when the AZ* signal is high.

During the AZ phase, the bottom plates of capacitors C5 and C6 are coupled through switches Q1 and Q2 to the signal inputs for signals SE1 and SE2, respectively. Thus, the bottom plates of these capacitors are charged up to the potential given by the respective input signals. The positive input of amplifier A5 and the top plates of capacitors C5 and C7 are coupled through switch Q5 to the 2.5 volt bias voltage. The output of amplifier A5 is coupled through switch QF to the negative input of the amplifier and the top plates of capacitors C6 and C8. Thus negative feedback is established and the top plates of capacitors C6 and C8 obtain the potential of 2.5 volts. The bottom plate of capacitor C7 is coupled directly to the output reference voltage, and the bottom plate of capacitor C8 is coupled indirectly through switch Q8 to the output reference voltage. The output, $V_{OUT}$, during this phase, is a constant 2.5 volts. Switches Q3 and Q10 are open circuits during this phase.

When AZ* goes high, switches Q3 and Q10 are closed. Switches Q1, Q2, Q5, Q8 and QF are open circuits. The signals SE1 and SE2 are effectively cut off from the amplifier circuit. During the period between when the AZ signal goes low and the AZ* signal goes high, the bottom plates of capacitors C5 and C6 contain instantaneous "snapshots" of the SE1 and SE2 voltages. On the AZ* phase, these two voltages are subtracted to create the output. This is done by shorting the bottom plates of C5 and C6 together and at the same time connecting C8 to the amplifier output. The resulting output $V_{OUT}$ will be (assuming C5=C6 and C7=C8):

$$V_{OUT} = (SE2 - SE1)\frac{C5}{C7} + \text{Output Reference}$$

and the voltage on the bottom plates of capacitors C5 and C6 are:

$$C5_b = C6_b = avg(SE1, SE2) + \frac{1}{2}(SE2 - SE1)\frac{C5}{C7}$$

Thus, the output represents the amplified, level shifted, difference voltage.

The preferred embodiment of the present invention is shown in FIG. 6. The embodiment of FIG. 6 comprises an auto-zeroing scheme that reduces offset due to switching inefficiencies. Whichever auto-zeroing scheme is used, the equations above for $V_{OUT}$ and C5 and C6 bottom plate voltages are the same. An improvement over the basic circuit is the addition of capacitors C9 and C10, which couple the bottom plates of capacitors C5 and C6, respectively, to the ground. Including these grounding capacitors serves to reduce the common mode voltage step, which would otherwise be equal to:

$$\Delta V_{cm} = \frac{1}{2}(SE2 - SE1)\frac{C5}{C7}.$$

The reduction of the common mode step is desirable because, in the basic circuit of FIG. 5, if the differential gain (C5/C7) is large, it is possible that the common mode input voltage of the amplifier can be exceeded during the AZ* phase.

In the figure, BSTRAP 1 and 2 represent bootstrap circuits. When the input of this circuit is at high logical state, the bootstrap output is equal to the ground voltage. When the input of this circuit is at a logical low, the output rises to roughly twice VBRIDGE. These bootstrap circuits are used to control the switches Q1, Q2, Q3 and Q4. Since these switches are comprised of CMOS transistors of n-type, for the switches to operate properly, the "on" voltage at the gates must be at least $(S_P+V_T)$ where $S_P$ is the signal being passed and $V_T$ is the transistor threshold voltage. Thus the bootstrap circuit permits the amplifier circuit to operate with a higher common mode signal than would be permissible if a simple 5 volt inverter were used.

The AZAMP represents an auto-zeroed amplifier. This amplifier has a built in sample-and-hold and an internal offset nulling circuit as described in the copending application entitled "Operational Amplifier with Self-Contained Sample and Hold and Auto Zero" filed Jul. 5, 1991, assigned to the same assignee. When AZ is high, the amplifier assumes VP and VN (the positive and negative amplifier inputs, respectively) are connected together and proceeds to null its offset. When H* is low, the output of the amplifier is "held" at it's previous value. H* is low whenever AZ is high. VBN is a bias voltage used by AZAMP to generate bias currents within the amplifier. SLEEP is a digital input (normally zero) that, when high, deactivates the circuitry and minimizes power dissipation.

As shown in FIG. 6, clock signals P1 and P2 are coupled to "D" flip flops DFF1 and DFF2. P1 and P2 are non-overlapping pulses with a nominal frequency of 500 kHz. P1 is passed to the CK input of DFF2, and P2 passes through inverter I1 to provide P2* to the CK input of DFF1. P2 is passed to the CK* input of both flip flops. With this clocking scheme, DFF1 changes state on the falling edge of P2, and DFF2 changes state on the rising edge of P1.

The "D" inputs of both flip flops are coupled to the Q* output of DFF2 which produces the switching signal SW1. SW1 is also provided to NOR gates N1 and N4, and to the gate of switch Q8. The Q output of DFF1 provides signal SW3 to NOR gate N3. The Q output of DFF2 provides switching signal SW2 to NOR gate N3, also, and to NOR gate N2, inverter I2 and the gate of switch Q10.

The externally provided SLEEP signal is passed to NOR gates N1 and N2. Thus allowing SW1 and SW2 to be disabled when SLEEP is high. When SLEEP is low, SW1 is passed through N1 to provide SW1* to the bootstrap circuit BSTRAP1. Similarly, SW2 is passed through N2 to provide SW2* to BSTRAP 2. These bootstrap circuits act as inverters, except that the logical high output value is close to twice the inputted VB voltage (VBRIDGE). The result is that a high-voltage version of each switching signal is produced. Thus, high-voltage switching signal SW1HV is provided by BSTRAP1 to the gates of switches Q1 and Q2. Also, SW2HV is provided by BSTRAP2 to the gates of switches Q3 and Q4. Q4 is added to the preferred embodiment to provide a load capacitance to BSTRAP2 that is equivalent to that seen by BSTRAP1. NOR gate N3 provides the AZ (auto-zero) signal to AZAMP and NOR gate N4 provides the ENABLE signal to the H* input of AZAMP. Thus a possible circuit configuration for supplying the necessary timing signals to the switched-capacitor differential amplifier is described comprising flip-flops, NOR gates and bootstrap circuits.

In this CMOS implementation, all of the switches, except Q9, comprise n-type transistor transmission gates with transmission controlled by a switching signal provided to the gate of each transistor. However, it is possible to implement this circuit utilizing NMOS, PMOS or CMOS switches, a combination thereof, or any suitable switches or switching means. For the preferred embodiment, Q9 is a p-type transistor with its gate coupled to an inverted switching signal. Q9 and Q10, in conjunction with inverter I2, form a single complementary transmission gate.

In the switched-capacitor network of the preferred embodiment, the circuit is connected in much the same manner as described for FIG. 5. The additions to the circuit provide symmetry to enhance the circuit's performance. These additions include Q4, Q6, Q7 and Q9. Although these additions enhance the performance of the circuit, it will be clear to those with knowledge in the art that the circuit can be produced without these additions.

As stated before, the addition of Q4 insures that the load capacitance seen by BSTRAP2 is equivalent to that seen by BSTRAP 1. This is done to maintain uniform switching speeds. Q6 is utilized to precharge the top plates of C6 and C8. Q5 and Q6 are now symmetrically connected and therefore contribute identical charge when turned off, thus, minimizing offset. QF is not needed in this circuit; the circuit relies on AZAMP accurately storing the offset during AZ. Q7 is added to make the impedance on the bottom plates of C7 and C8 equivalent. This further enhances the equality of charge injection for Q5 and Q6. The complementary transmission gate of Q9 and Q10 is required for correct operation when the signal being transmitted approaches the transistor gate voltage.

Q4 is coupled in parallel with Q3 between nodes 50 and 51. Q6 is coupled to the reference voltage VREF (2.25 volts for this embodiment) and node 53. Q7 is coupled to the bottom plate of C7 and the Output Reference node 54. The gate of Q7 is coupled to the amplifier voltage supply VDD (5 volts for this embodiment).

For this embodiment, Q1 and Q2 are controlled by switching signal SW1HV; Q3 and Q4 are controlled by switching signal SW2HV; Q8 is controlled by SW1; and the complementary transmission gate formed by I2, Q9 and Q10 is controlled by SW2. It is possible in an alternate embodiment to omit the need for bootstrap circuits by utilizing complementary CMOS switches for Q1-Q4. In this case, NOR gates N1 and N2 are replaced with OR gates which will control Q1-Q4 directly. If the sleep function is also omitted, switches Q1 and Q2 can be controlled by SW1 directly, and switches Q3 and Q4 can be controlled by SW2 directly. NOR gates N1 and N2 are not necessary in this alternate embodiment. If the sleep function is omitted, but bootstrap circuits are used, then NOR gates N1 and N2 are omitted, and the input to BSTRAP 1 is SW2 and the input to BSTRAP 2 is SW1.

Figure 8:
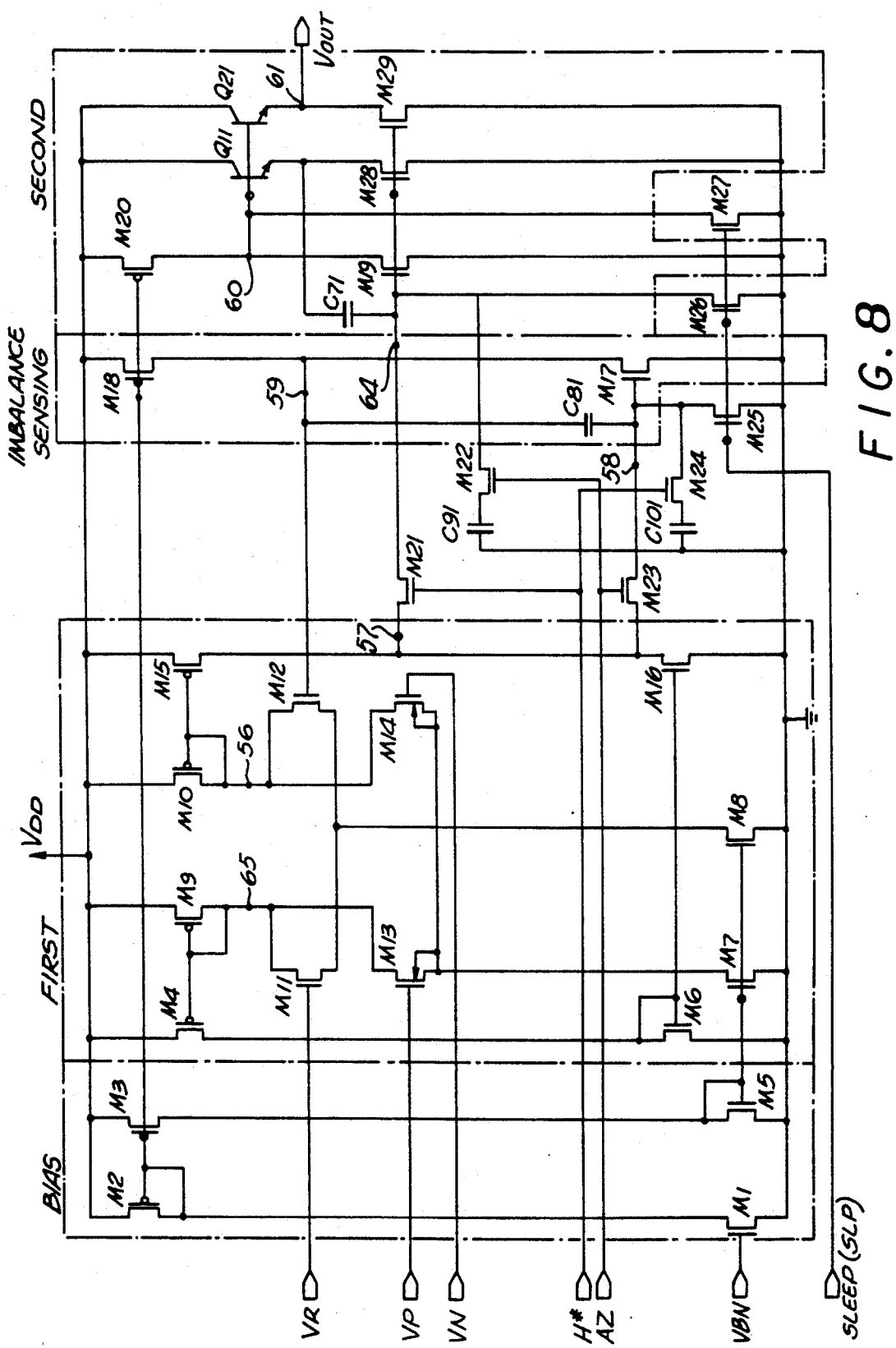
FIG. 8 illustrates the AZAMP utilized in the preferred embodiment of the present invention.

The circuit of the AZAMP shown in FIG. 6 and described in copending application filed Jul. 5, 1991 is illustrated in FIG. 8. In FIG. 8, reference voltage signal VR is provided to the gate of NMOS transistor M11. Signal VP, the voltage signal coupled to the positive input node of the AZAMP, is coupled to the gate of NMOS transistor M13. Signal VN, the voltage input signal to the negative input terminal of the AZAMP, is coupled to the gate of NMOS transistor M14. Signal H* is coupled to the gates of NMOS transistors M21 and M24. Signal AZ is coupled to the gates of transistors M22 and M23. Signal VBN is coupled to the gate of NMOS transistor M1. SLEEP is coupled to the gates of NMOS transistors M25, M26 and M27.

The drain of NMOS transistor M1 is coupled to the drain of PMOS transistor M2. The drain of transistor M2 is coupled to its own gate as well as being coupled to the gate of PMOS transistor M3. The source of transistor M2 is coupled to power supply $V_{DD}$. The source of transistor M1 is coupled to ground. The drain of PMOS transistor M3 is coupled to the drain of NMOS transistor M5 and also coupled to the gate of transistor M5. The gate of transistor M5 is also coupled to the gates of NMOS transistors M7 and M8. The sources of transistors M5, M7 and M8 are coupled to ground.

The gate of PMOS transistor M3 is coupled to the gates of PMOS transistors M18 and M20. The sources of transistors M3, M18 and M20 are coupled to power supply $V_{DD}$. The drain of transistor M18 is coupled to the drain of NMOS transistor M17 as well as coupled to the gate of NMOS transistor M12 at node 59. The bottom plate of capacitor C81 is also coupled to node 59. The top plate of capacitor C81 is coupled to the gate of transistor M17 as well as coupled to the source of NMOS transistor M23 at node 58. The drain of NMOS transistor M24 and the drain of NMOS transistor M25 are also coupled to node 58. The sources of transistors M25, M17, M26 and M27 are coupled to ground.

The source of transistor M24 is coupled to the top plate of capacitor C101. The bottom plate of capacitor C101 is coupled to ground. The drain of transistor M23 is coupled to the drain of NMOS transistor M16 at node 57. The drain of NMOS transistor M21 as well as the drain of PMOS transistor M15 are also coupled to node 57. The source of transistor M21 is coupled to the gates of NMOS transistors M19, M28 and M29 at node 64. The top plate of capacitor C71 and the drain of NMOS transistor M22 are also coupled to node 64. The drain of NMOS transistor M26 is coupled to node 64. The source of transistor M22 is coupled to the top plate of capacitor C91, and the bottom plate of capacitor C91 is coupled to ground. The bottom plate of capacitor C71 is coupled to the emitter of bipolar junction transistor Q11 as well as coupled to the drain of NMOS transistor M28. The base of transistor Q11 is coupled to the base of bipolar junction transistor Q21 and the drain of NMOS transistor M27 at node 60. The drain of transistor M20 and the drain of transistor M19 are also coupled to node 60. The collectors of transistors Q11 and Q21 are coupled to the power supply of $V_{DD}$.

The sources of transistors M19, M28 and M29 are coupled to ground. The emitter of transistor Q2 is coupled to the drain of transistor M29 at node 61 which provides the output voltage to node 55 in FIG. 6. The gate of PMOS transistor M15 is coupled to the gate and drain of PMOS transistor M10 at node 56. The drains of NMOS transistors M12 and M14 are also coupled to node 56. The source of transistor M12 is coupled to the source of transistor M11 as well as coupled to the drain of NMOS transistor M8. The source of transistor M14 is coupled to the source of transistor M13 as well as coupled to the drain of transistor M7. The drain of transistor M13 is coupled to the drain of transistor M11 as well as the drain of PMOS transistor M9 at node 65. The gate of transistor M9 as well as the gate of PMOS transistor M4 are also coupled to node 65. The sources of transistors M4, M9, M10 and M15 are coupled to power supply $V_{DD}$. The drain of transistor M4 is coupled to the drain and gate of NMOS transistor M6 as well as coupled to the gate of transistor M16. The source of transistor M6 and the source of transistor M16 are coupled to ground.

Signals VP and VN represent the differential input signals to the AZAMP. Signal VR is a reference DC voltage (2.25 volts in this case). Signal VBN is a DC voltage to set the current in transistor M1 at approximately 20 micro-amps. SLEEP is an optional input signal which when high, disables the amplifier and reduces its supply current. During normal operation, the SLEEP signal is grounded.

FIG. 8 can be viewed as being divided into separate blocks with transistors M1–M3 and M5 labeled as the bias stage. Transistors M4 and M6–M16 comprise the first stage. Transistors M17 and M18 and capacitor C81 comprise the imbalance sensing stage. Transistors M19, M20, M28, M29, Q11 and Q21 and capacitor C71 comprise the second stage. The design of the stages of the AZAMP shown in FIG. 8 is only an example. The stages are not limited to this design exclusively.

When signal AZ is low (deactivated) and signal H* is high, the AZAMP comprises a two stage amplifier with a push-pull input stage as shown in FIG. 8. When signal AZ is high and signal H* is low, the AZAMP also comprises a third stage (imbalance sensing stage) for providing the auto-zero function. Signals AZ and H* should be non-overlapping for proper operation of the AZAMP. Switches are added to this configuration to provide the sample and hold function. The purpsoe is to disconnect the second stage at node 64 during the hold mode (H* low). By disconnecting the second stage during the hold mode, the output voltage of AZAMP remains unchanged due to the voltage stored on capacitor C71 (accumulated during the sample mode, H* high).

In this example, hold mode occurs when H* is low and sample mode occurs when H* is high. The circuitry in FIG. 8 that implements the switch is transistor M21. The turn on and turn off of transistor swicth M21 is controlled by signal H*. When signal H* is high, switch M21 is closed and when signal H* is low, switch M21 is open. In addition, transistor M22 and capacitor C91 cancel the charge injected into capacitor C71 when transistor M21 turns off. AZ* should be high whenever H* is high. (Note that other charge cancelling switch designs can be implemented.)

The auto zero function is added to this circuit by employing an imbalance sensing stage for sensing any imbalance that exists in the first stage. Furthermore, a small differential current is introduced at nodes 65 and 56. During auto zeroing, signals VP and VN are both tied to zero references. In this state, offset occurs if an imbalance exists in the first stage. This imbalance is sensed with the imbalance sensing stage.

During auto zero (AZ signal high) the imbalance sensing stage is connected to the first stage output at node 57. If the first stage is balanced, the output of the imbalance sensing stage at node 59 is near the center of the power supply. Imbalance in the first stage is adjusted by connecting node 59 of the imbalance sensing stage to one side of the differential pair of the first stage. Since the other side of the differential pair is connected to a bias voltage position near the center of the supply, the differential pair introduces a current at nodes 65 and 56 to counter the imbalance.

When the AZ signal turns off, node 57 is disconnected from node 58 and the correction voltage is stored on capacitor C81. The switch that disconnects nodes 57 and 58 is transistor M23. The turn on and turn off of transistor switch M23 is controlled by AZ. When AZ is high, auto-zeroing switch M23 is closed and switch M22 of the charge cancelling circuit for sample and hold switch M21 is also closed. AZ controls the charge cancelling circuitry for sample and hold switch M21 since when AZ is high, sample and hold switch M21 is open and transistor M22 is turned on to cancel the charge from sample and hold capacitor C71. Similar reasoning is true for why H* controls charge cancelling transistor M24 for auto-zeroing switch M23. When H* is high, AZ is low, thereby opening auto-zeroing switch M23. Charge cancellation for transistor M23 is provided by transistor M24 and capacitor C101.

The charge injected into correction voltage capacitor C81 by the switch transistor M23 results in an offset error. This error is amplified by the transconductance ratio of transistors M11 and M12 to transistors M13 and M14. This ratio is typically in the range of 1:8–1:10. The actual voltage chosen for signal VR can be developed in several ways. For the actual AZAMP application, a simple band gap reference can be used. Improved performance can be obtained by establishing signal VR at the same voltage as node 60 when the output is at ground. Further improvements can be made by compensating this voltage for base current drawn by transistors Q11 and Q21.

In sleep mode the AZAMP is to be powered down. Circuitry elsewhere pulls signal VBN to ground to turn off most bias currents. Additional pull down transistors M25, M26 and M27 pull down the remaining floating nodes.

Figure 7:
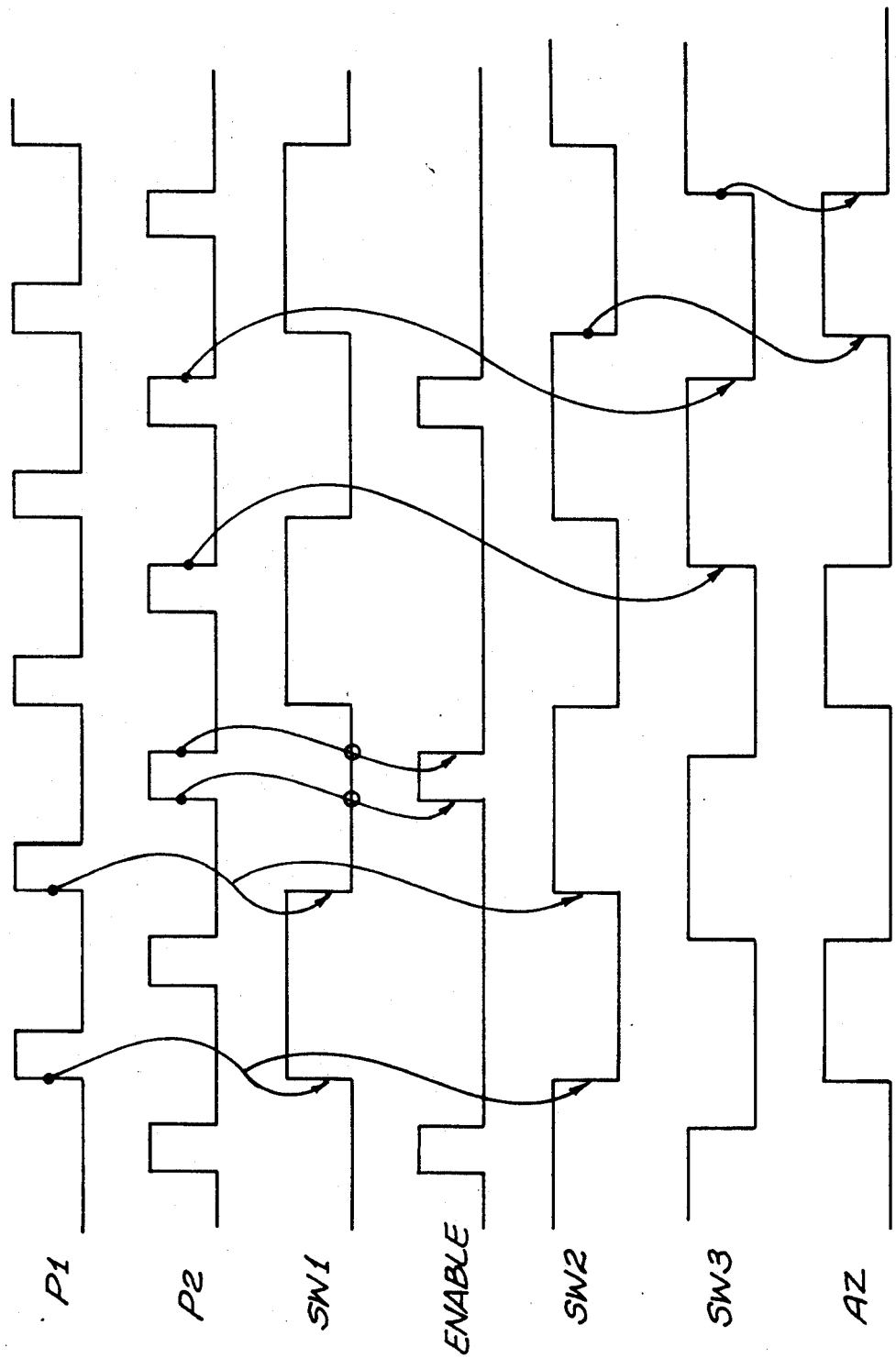
FIG. 7 illustrates a timing diagram of the timing signals provided in the preferred embodiment.

The timing signals for the preferred embodiment are illustrated in FIG. 7. These timing signals are basically the same as those for the basic invention shown in FIG. 5. However, the two signals ENABLE and AZ are specialized signals created for use in AZAMP and switches Q5 and Q6 to minimize errors caused by non-ideal switching.

As shown in FIG. 7, P1 and P2 are non-overlapping clock signals. These signals are used to generate oscillations in the two flip-flops at one-half of the frequency of P1 and P2. For clarity purposes, the non-overlap time between P1 and P2 has been increased. In practice it is much smaller than the widths of P1 and P2. As shown, DFF1 changes state on the falling edge of P2, while DFF2 changes state on the rising edge of P1. This configuration generates an output from DFF1 that lags the output of DFF2 by an amount determined by the time delay between the falling edge of P1 and the rising edge of P2. The "Q" outputs of each flip flop, SW3 and SW2 are used to generate AZ. The rising edge of AZ coincides with the falling edge of SW2 and the falling edge of AZ coincides with the falling edge of SW3. This serves to create a pulse that matches signal SW1 in phase and frequency, but has a slightly smaller duty cycle (i.e. 37.5% vs. 50% for SW1). This shortened AZ signal is provided to AZAMP to allow AZAMP to perform auto-zeroing. SW1 corresponds to the "AZ phase" or precharge phase of the invention in FIG. 5. In this embodiment the auto-zeroing feedback is disabled before the switching of the rest of the circuit to prevent auto-zeroing errors during transition.

The ENABLE signal of this embodiment is generated in phase with P2 whenever SW1 is low. This establishes a short pulse (i.e. 12.5% duty cycle) which occurs near the middle of (SW1*). SW2 corresponds to the "AZ* phase" of the basic invention.

Thus the ENABLE signal is designed to have a timing buffer between it and the state transitions. The ENABLE signal is provided to the H* (hold prime) signal of AZAMP. Thus while the ENABLE pulse is high, AZAMP acquires a sample of the output (built-in sample and hold circuitry), and the AZAMP holds this value for as long as the ENABLE signal is low. Thus, unlike the invention as described in FIG. 5, $V_{OUT}$ retains the valid output through the duration of the subsequent precharge state.

Thus, a CMOS, switched-capacitor, differential amplifier has been described. Though the inclusion of special circuitry, such as the AZAMP and timing circuitry, improves the performance of the invention, it is clear that this is only the preferred embodiment and that equivalent means can be substituted without departing from the scope of the invention.

Though described in reference to a servo motor, the present invention is not limited to this specific environment, but can find use in a variety of applications.

I claim:

1. A switched-capacitor, differential amplifier circuit comprising:
   a differential amplifier having a positive input, a negative input, and an output;
   a first switch coupled to a first input node and a first node;
   a second switch coupled to a second input node and a second node;
   a third switch coupled to said first node and said second node;
   a first capacitor coupled to said first node and said positive input;
   a second capacitor coupled to said second node and said negative input;
   a fourth switch coupled to said positive input and a first reference voltage;
   a fifth switch coupled to said negative input and said output;
   a third capacitor coupled to said positive input and a second reference voltage;
   a fourth capacitor coupled to said negative input and a sixth switch;

said sixth switch selectively coupled to said second reference voltage and said output; said sixth switch responsive to first and second control signals, respectively;
   said first, second, fourth and fifth switches responsive to said first control signal; said third switch responsive to said second control signal.

2. The circuit of claim 1, wherein said first and second control signals comprise non-overlapping, alternating clock signals.

3. The circuit of claim 1 further including:
   a fifth capacitor coupled between said first node and ground;
   a sixth capacitor coupled between said second node and ground.

4. A switched-capacitor differential amplifier circuit comprising:
   a first switch coupled between a first external input node and a first internal node;
   a second switch coupled between a second external input node and a second internal node;
   a third switch coupled between said first and second internal nodes;
   a first capacitor having a first plate coupled to said first internal node and having a second plate coupled to a third internal node;
   a second capacitor having a first plate coupled to said second internal node and a second plate coupled to a fourth internal node;
   a fourth switch coupled between said third internal node and an external zero-reference node;
   a fifth switch coupled between said fourth internal node and said external zero-reference node;
   a first plate of a third capacitor coupled to said third internal node;
   a second plate of said third capacitor coupled to an output reference node;
   a first plate of a fourth capacitor coupled to said fourth internal node;
   a sixth switch coupled between a second plate of said fourth capacitor and said output reference node;
   a seventh switch coupled between a voltage output node and said second plate of said fourth capacitor;
   a differential amplifying means having a positive input coupled to said third internal node, and having a negative input coupled to said fourth internal node; said amplifying means having an output coupled to said voltage output node; said amplifying means receiving a plurality of timing signals and reference signals;
   a timing control means receiving a plurality of clock signals from an external source; said timing control means providing said plurality of timing signals; a plurality of said timing signals for controlling said switches; said timing control means coupled to said amplifying means to provide a plurality of said timing signals.

5. The circuit of claim 4, wherein said switches comprise a single n-type transistor with a gate receiving one of said timing signals.

6. The circuit of claim 4, wherein said seventh switch comprises an n-type and a p-type transistor coupled in parallel, and an inverter for providing an inverted timing signal to a gate of the p-type transistor; said inverter and a gate of said n-type transistor receiving one of said timing signals.

7. The circuit of claim 4, wherein said timing control means comprises;

a first flip-flop receiving a first clock signal, an inverted first clock signal, and a first timing signal; said first flip-flop providing a second timing signal;

a second flip-flop receiving said first clock signal, a second clock signal, and said first timing signal; said second flip-flop providing said first timing signal and a third timing signal;

a first NOR gate receiving an external disable signal and said first timing signal; said first NOR gate providing a first enabled timing signal;

a second NOR gate receiving said external disable signal and said third timing signal; said second NOR gate providing a second enabled timing signal;

a third NOR gate receiving said second and said third timing signals; said third NOR gate providing a fourth timing signal;

a fourth NOR gate receiving said first timing signal and said inverted first clock signal; said fourth NOR gate providing a fifth timing signal;

a first bootstrap circuit with an output voltage range dependent on an external reference voltage; said first bootstrap circuit receiving said first enabled timing signal and providing a first bootstrap timing signal;

a second bootstrap circuit with an output voltage range dependent on said external reference voltage; said second bootstrap circuit receiving said second enabled timing signal and providing a second bootstrap timing signal.

8. The circuit of claim 7, wherein said first and second switches are controlled by said first bootstrap timing signal; said third switch is controlled by said second bootstrap timing signal; said fourth and fifth switches are controlled by said fourth timing signal; said sixth switch is controlled by said first timing signal; said seventh switch is controlled by said third timing signal.

9. The circuit of claim 7, wherein said amplifying means receives said fifth timing signal to control sample-and-hold circuitry within said amplifying means; said amplifying means receiving said fourth timing signal to control zeroing of an output offset.

10. The circuit of claim 7, wherein said first and second clock signals comprise non-overlapping, alternating clock signals.

11. The circuit of claim 4 further including an eighth switch coupled in parallel with said third switch between said first and second internal nodes; said eighth switch operating simultaneously and in a like manner to said third switch.

12. The circuit of claim 4 further including:
an eighth switch coupled between said second plate of said third capacitor and said output reference node; said eighth switch controlled by a constant voltage source.

13. The circuit of claim 4 further including:
a fifth capacitor coupled between said first internal node and a constant voltage source;
a sixth capacitor coupled between said second internal node and said constant voltage source.

14. The circuit of claim 4 wherein said timing control means comprises; a first flip-flop receiving a first clock signal, an inverted first clock signal and a first timing signal; said first flip-flop providing a second timing signal;

a second flip-flop receiving said first clock signal, a second clock signal, and said first timing signal; said second flip-flop providing said first timing signal and a third timing signal;

a first OR gate receiving said second and said third timing signals; said first OR gate providing a sixth timing signal;

a second OR gate receiving said first timing signal and said inverted first clock signal; said second OR gate providing a seventh timing signal;

a third NOR gate receiving said second and said third timing signals; said third NOR gate providing a fourth timing signal;

a fourth NOR gate receiving said first timing signal and said inverted first clock signal; said fourth NOR gate providing a fifth timing signal.

15. The circuit of claim 14, wherein said first and second switches are controlled by said sixth timing signal; said third switch is controlled by said seventh timing signal; said fourth and fifth switches are controlled by said fourth timing signal; said sixth switch is controlled by said first timing signal; and said seventh switch is controlled by said third timing signal.

16. The circuit of claim 15 wherein said first and second switches are comprised of CMOS switches.

17. The circuit of claim 16 wherein said third, fourth, fifth, sixth, and seventh switches are n channel switches.

18. The circuit of claim 14 wherein said first and second clock signals comprise non-overlapping, alternating clock signals.

19. The circuit of claim 14, wherein said amplifying means receives said fifth timing signal to control sample-and-hold circuitry within said amplifying means; said amplifying means receiving said fourth timing signal to control zeroing of an output offset.

* * * * *